United States Patent
Lee

(10) Patent No.: US 6,469,369 B1
(45) Date of Patent: Oct. 22, 2002

(54) LEADFRAME HAVING A MOLD INFLOW GROOVE AND METHOD FOR MAKING

(75) Inventor: Hyung Ju Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/607,778

(22) Filed: Jun. 30, 2000

(30) Foreign Application Priority Data

Jun. 30, 1999 (KR) .............................................. 99-12393

(51) Int. Cl.[7] .......................................... H01L 23/495
(52) U.S. Cl. ...................... 257/670; 257/787; 257/788; 257/789
(58) Field of Search ......................... 257/670, 671–680, 257/694, 701, 787–796

(56) References Cited

U.S. PATENT DOCUMENTS

| | | | | |
|---|---|---|---|---|
| 4,301,464 A | * | 11/1981 | Otsuki ........................... | 357/70 |
| 4,530,152 A | | 7/1985 | Roche et al. .................. | 29/588 |
| 5,041,902 A | | 8/1991 | McShane ....................... | 357/79 |
| 5,157,480 A | | 10/1992 | McShane et al. ............. | 357/74 |
| 5,172,213 A | | 12/1992 | Zimmerman ................ | 257/796 |
| 5,172,214 A | | 12/1992 | Casto ............................ | 257/676 |
| 5,278,446 A | | 1/1994 | Nagaraj et al. ............... | 257/707 |
| 5,428,248 A | | 6/1995 | Cha .............................. | 257/676 |
| 5,517,056 A | * | 5/1996 | Bigler ........................... | 257/666 |
| 5,521,429 A | | 5/1996 | Aono et al. ................... | 257/676 |
| 5,701,034 A | | 12/1997 | Marrs ........................... | 257/706 |
| 5,783,691 A | | 7/1998 | Son ............................... | 253/693 |
| 5,835,988 A | | 11/1998 | Ishii .............................. | 257/684 |
| 5,866,939 A | | 2/1999 | Shin et al. .................... | 257/666 |
| 5,894,108 A | | 4/1999 | Mostafazadeh et al. ..... | 174/52.4 |
| 5,977,613 A | | 11/1999 | Takata et al. ................. | 257/666 |
| 5,977,630 A | | 11/1999 | Woodworth et al. ......... | 257/712 |
| 5,986,333 A | * | 11/1999 | Nakamura .................... | 257/667 |
| 6,013,947 A | * | 1/2000 | Lim .............................. | 257/685 |
| 6,143,981 A | | 11/2000 | Glenn ........................... | 174/52.4 |
| 6,177,718 B1 | * | 1/2001 | Kozono ......................... | 257/666 |
| 6,208,020 B1 | * | 3/2001 | Minamio ....................... | 257/684 |
| 6,222,258 B1 | * | 4/2001 | Asano ............................ | 257/675 |
| 6,229,200 B1 | * | 5/2001 | Mclellan ....................... | 257/666 |
| 6,242,281 B1 | | 6/2001 | Mclellan et al. ............. | 438/106 |
| 6,294,100 B1 | | 9/2001 | Fan et al. ...................... | 216/14 |

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 404098864 A * | 3/1992 |
| JP | 405166992 A * | 7/1993 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

* cited by examiner

Primary Examiner—Olik Chaudhuri
Assistant Examiner—Nathan W. Ha
(74) Attorney, Agent, or Firm—Jenkens & Gilchrist, P.C.

(57) ABSTRACT

A leadframe having a mold inflow groove provides for an increase in the number of inner leads for connecting with outer electrical sources and accurate singulation. A molding compound is introduced through mold inflow grooves positioned at both sides of a tie bar into the cavity so that no culls remain on the tie bar after molding. The end of a runner of the mold die is positioned at a sufficient distance away from the molding area of the leadframe to allow the top and bottom surfaces of the tie bar to remain free of culls.

19 Claims, 4 Drawing Sheets

LEADFRAME HAVING A MOLD INFLOW GROOVE AND METHOD FOR MAKING

BACKGROUND OF THE INVENTION

1. Field of the Invention

The present invention relates in general to a leadframe, and in specific to a leadframe suitable for micro leadframe packages, and more specifically, to a leadframe having a mold inflow groove for increasing the number of potential leads on a package.

2. History of the Related Art

In the semiconductor industry, packaging techniques of integrated circuits have generally been and continue to be developed to meet the requirements of slimness and packaging reliability. The requirement for slimness forces packages to be reduced even to semiconductor chip size. In one aspect of packaging reliability, much effort has been made to develop fabricating techniques for semiconductor packages, which are improved in mechanical and electrical reliability.

A conventional leadframe comprises a frame body, tie bars internally extended from the comers of the frame body, a die pad located in the center of the frame body having a contact with the tie bars, and a plurality of inner leads extended from the frame body with the tie bar ends being located along the perimeter of the die pad. The die pad provides a site on which a semiconductor chip may be mounted.

A typical method for fabricating a semiconductor package using the above leadframe comprises several steps. First, a semiconductor chip is bonded on the die pad. Next, bonding pads of the semiconductor chip we wire-bonded to corresponding inner leads by the use of a conductive connecting member such as gold wire, so that the semiconductor chip is electrically connected to the inner leads.

In a conventional mold die equipped with a package gate-type mold gate, a cavity is formed by combining an upper cavity bar with a lower cavity bar. A mold gate is provided which is directly connected to the cavity and allows a molding compound to be charged safely and homogeneously into the cavity and a runner which is directly connected to the mold gate. Between the mold gate and the upper surface of the tie bar, there is a predetermined gap. The runner functions as a passage through which the molding compound flows.

During the molding, a leadframe is positioned within the cavity while a molding compound is charged to a port inside a cull block. As the molding compound is pressurized, the molding compound which is melted by the heat from the mold die flows through the runner, a passage formed in the upper and lower cavity, the mold gate, an inlet to the cavity, and finally into the cavity. After a period of time, the molding compound is cured to finalize the molding process.

After the molding, singulation is conducted to separate packages from the mold frame into independent individual package units. During singulation, packages are uprightly secured to the singulating apparatus and turned upside down before final singulation.

Since the mold gate is spaced at a distance from the upper surface of the tie bar, the molding compound flows through the mold gate and into the cavity. However, after completion of the molding, a thickness of a cull is left on the area where the mold gate of the leadframe is positioned.

Due to limitations of the physical equipment, micro leadframes are impossible to subject to live bug singulation. Thus, dead bug singulation must be performed.

When micro leadframes are subjected to live bug singulation, burrs are formed at the ends of leads by the action of a punch directing downwardly. In this case, mounting defects occur due to the orientation of the burrs. Therefore, after the micro leadframe is positioned in a singulation die, sides of a mold body as well as leadframe corner areas to which the tie bars extend are also subjected to dead bug singulation, thereby preventing the mounting defects attributed to the burrs.

Where a molding process is conducted using the conventional leadframe and the mold die comprising the mold gate, the molding compound which remains on the leadframe comer areas connected to the tie bars causes the tie bars to be higher in level at the mold gate than other sites, resulting in non-planarity of the mold frame/singulation die.

In the mold die applied by the conventional leadframe for micro leadframes and the package gate-type mold gate, the mold gate is directly connected to the cavity, so that the molding compound flowing through the runner is immediately introduced into the cavity. Accordingly, after the molding, a dreg of a cured molding compound remains on the upper surface of the tie bar. The mold frame thus is not horizontally positioned on the singulation die due to the thickness of the molding compound left on the tie bar, so that the dead bug singulation cannot be conducted accurately.

Attempts, such as creating tie bars having Y shapes, have been made to eliminate the above problems. Although being advantageous in the accurate singulation, these attempts suffer from several problems.

Because the tie bars of such attempts are Y-shaped, the area necessary to form the inner leads in the leadframe is reduced as much as the area occupied by the branches of the Y-shape. As a result, the number of the inner leads is decreased. The decrease in inner leads is a significant drawback in present-day applications, especially with the decreasing size of the semiconductor packages and the increasing efficiency of the same.

BRIEF SUMMARY OF THE INVENTION

In an effort to overcome this and other problems encountered in the prior art, and to provide a leadframe which secures a sufficient number of inner leads for connecting with outer power sources as well as allowing singulation to be implemented accurately, a molding compound is introduced through mold inflow grooves positioned at the left and right sides of a tie bar into the cavity so that no culls remain on the tie bar after the molding.

In one embodiment of the present invention, there is provided a leadframe comprising a frame body, tie bars internally extended from the comers of the frame body, a die pad located in the center of the frame body for providing a site on which a semiconductor chip is mounted and having a contact with the tie bars, and a plurality of inner leads extended from the frame body with their ends being located along the perimeter of the die pad. Located at each comer area of the frame body is a mold inflow groove. The mold inflow groove is connected with the empty space around the inner leads. When loading the leadframe on a mold die, the end of a runner of the mold die is positioned at a distance away from a molding area of the leadframe, and the mold inflow groove is divided into two domains by each tie bar. The mold compound is introduced through the mold inflow grooves positioned on either side of the tie bar and into the cavity so that no culls remain on the tie bar after the molding.

In practice, the mold compound departs the runner; flows through the mold inflow groove at both sides of the tie bar;

enters the leadframe gate formed by the mold inflow groove; travels through the upper and lower cavity bars; and fills the cavity formed by the upper and lower cavity bars.

DETAILED DESCRIPTION OF THE INVENTION

Figure 1:
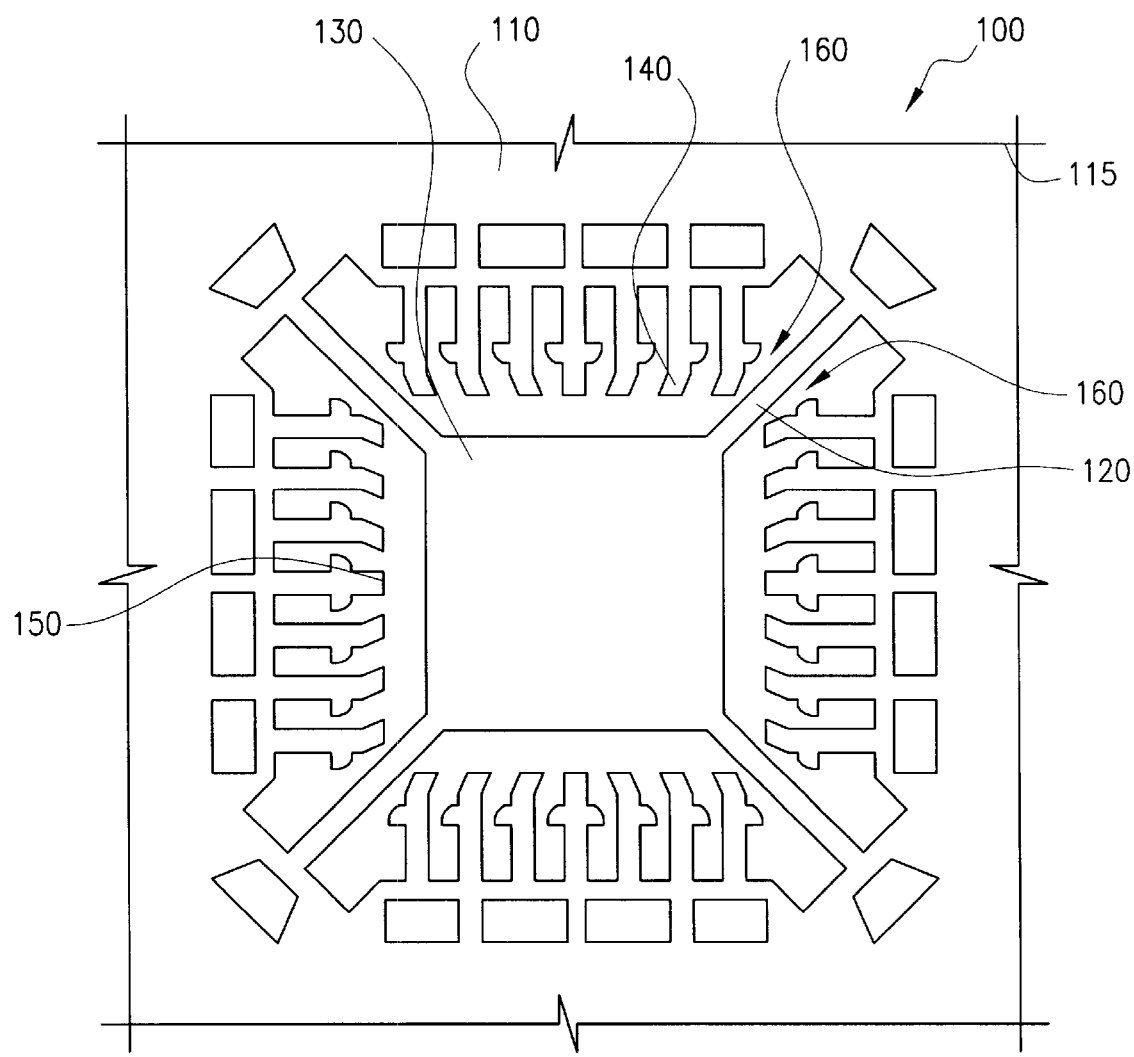
FIG. 1 is a top plan view of one embodiment of a leadframe of the present invention with shading to indicate void areas of the leadframe.

Referring now to the figures, and in particular FIG. 1, a leadframe 100 is shown. The leadframe 100 comprises a frame body 110 of a generally square shape, tie bars 120 internally extended from corners 115 of the frame body 110, a square die pad 130 located in the center of the frame body 110, and a plurality of inner leads 140. As seen in FIG. 1, the die pad 130 is directly in contact with the tie bars 120. Inner leads 140 have ends 150 located along the perimeter of the die pad 130. At each corner of the die pad 130 is formed a mold inflow groove 160, connected with the open area surrounding the inner leads 140. The mold inflow groove 160 is divided into two domains defined by the two horizontal sides of the tie bar 120.

Bisecting the area of the mold inflow groove 160, the tie bars 120 directly extend to a corner 115 of the frame body 110 so that, in contrast to conventional leadframes, the leadframe 100 of the present invention can secure a sufficient number of inner leads 140.

Figure 2:
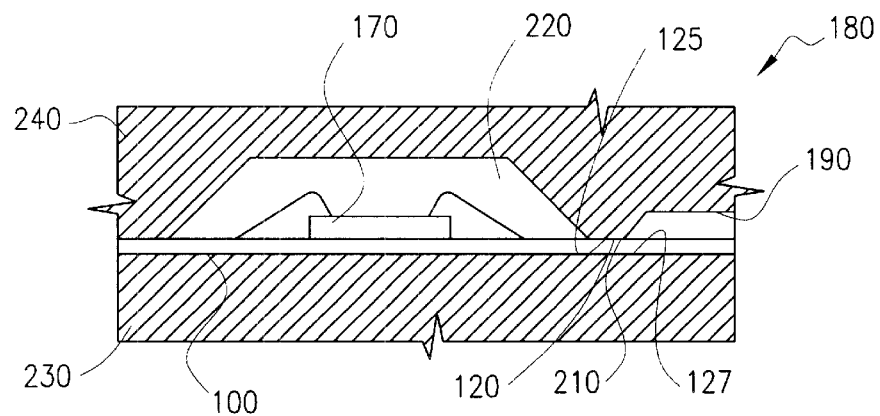
FIG. 2 is a cross-section of the leadframe of FIG. 1 after a mold die and semiconductor chip have been secured to the leadframe.

Referring now to FIG. 2, a semiconductor chip 170 has been connected to the surface of the leadframe 100. A mold die 180 comprising a lower cavity bar 230 and an upper cavity bar 240 has been secured to the leadframe 100. A runner 190 for use in the mold process has been placed adjacent a die border 210. As a result of the mold die 180 encompassing the leadframe 100, a cavity 220 forms, which the mold compound 250 (FIG. 4) fills during the molding process.

Figure 4:
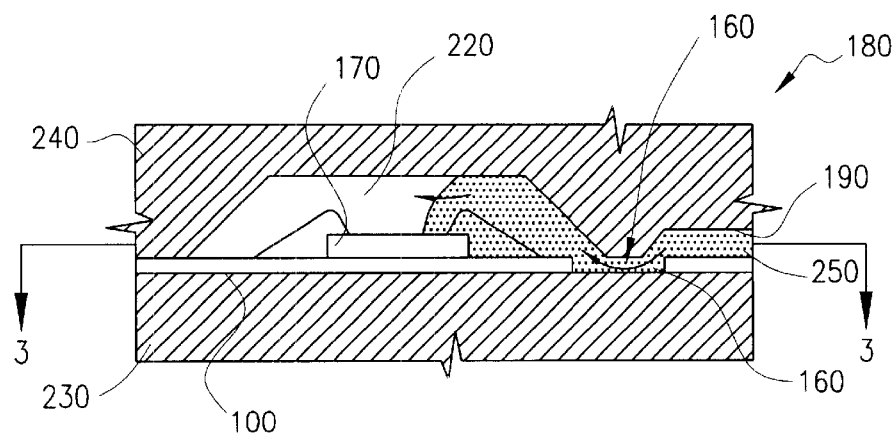
FIG. 4 is a cross-section of the leadframe of FIG. 3 taken along the line 4—4, showing the mold flowing from the runner into the mold-inflow groove and then into the cavity surrounding the semiconductor chip and leadframe.
Figure 3:
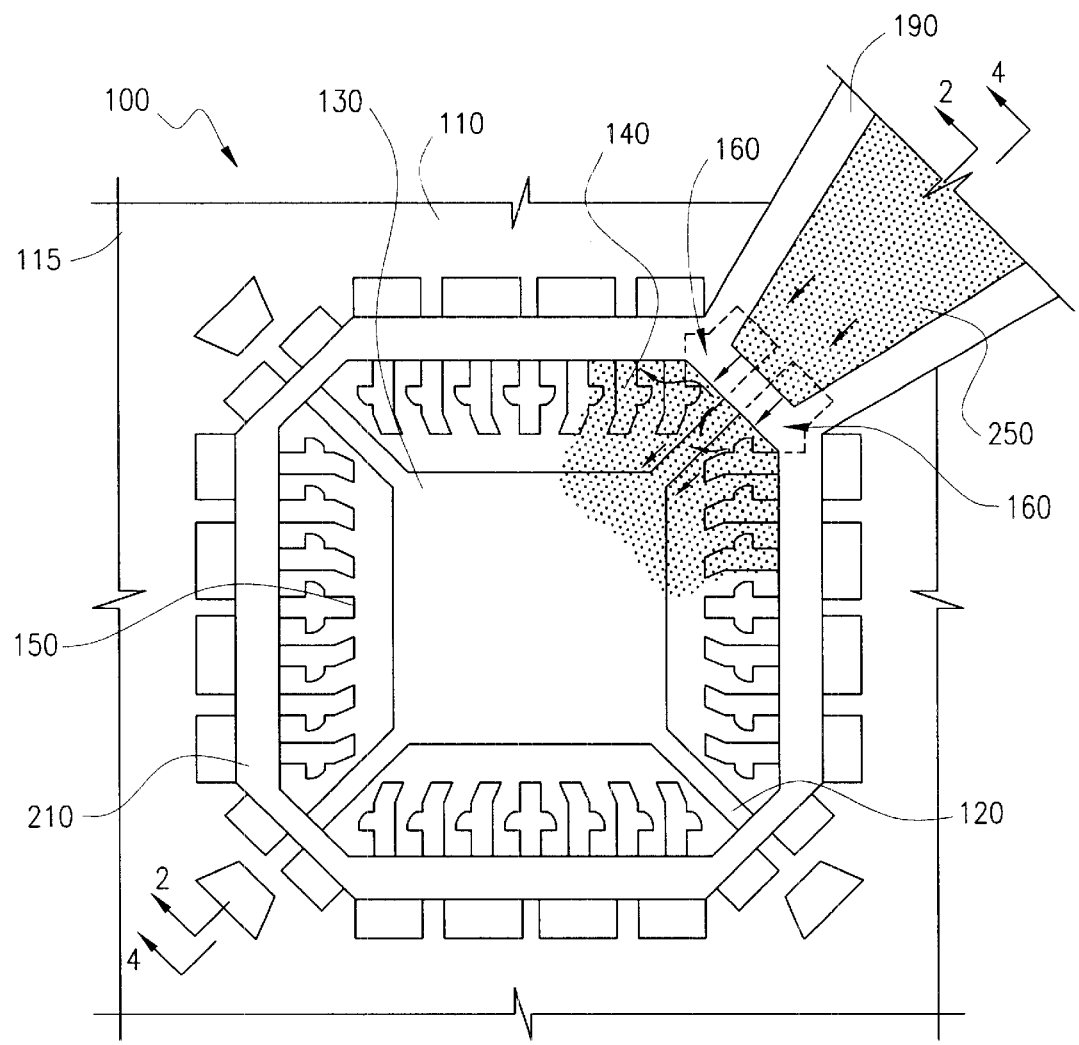
FIG. 3 is a top plan view taken along the 3—3 line of FIG. 4 showing the mold flow path into the cavity formed by the mold die and leadframe.

Referring now to FIG. 3 and FIG. 4, FIG. 3 is a top plan view taken along line 3—3 of FIG. 4. FIG. 4 is a cross-section of one embodiment of the present invention taken along line 4—4 of FIG. 3. After the mold die 180 has been secured around the leadframe 100, the mold compound 250 travels from the runner 190 and is introduced into the mold inflow groove 160 positioned at opposite sides of the tie bar 120 and advanced toward the cavity 220.

During molding of one embodiment of the present invention, the runner 190 is spaced at a sufficient distance from the molding area of the leadframe 100 and the mold inflow groove 160 except for where the die border 210 is positioned. A void area is formed between the lower cavity bar 230 and the upper cavity bar 240 adjacent to the tie bar 120. This void area results in the mold inflow groove 160 which functions as a gate for the mold compound 250, which flows on both lateral sides of the tie bar 120. Accordingly, no culls of the cured mold compound 250 are allowed to remain on the upper surface 125 and lower surface 127 of the tie bars 120 (FIGS. 2 and 6).

Figure 5:
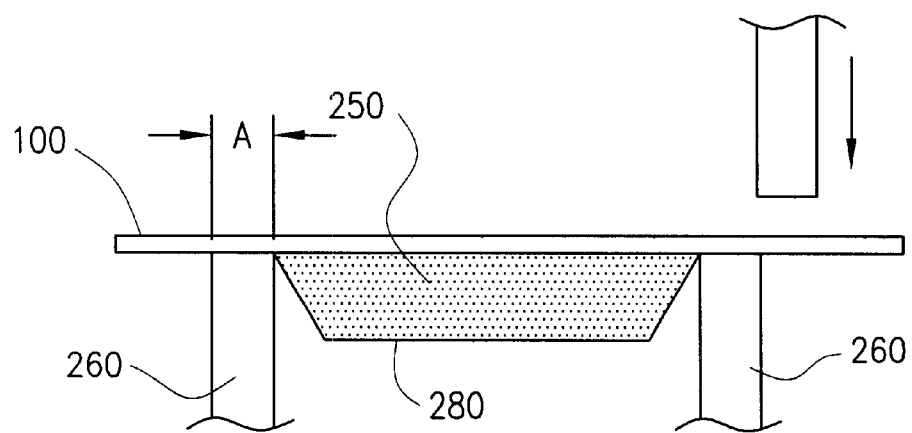
FIG. 5 is a side view of an exemplary singulation step for the leadframe of FIG. 1 after the molding process has been completed.

Referring now to FIG. 5, an upper side 280 of the mold compound 250 which fills the mold inflow groove 160 at both sides of the tie bar 120 is shown as positioned on two singulation dies 260. Advantageously, the entire leadframe 100 is completely level with the singulation die 260 when being placed on the singulation die 260, which allows the singulation to be conducted smoothly and accurately. In the area delineated by double arrow A, which is where the singulation dies 260 grip the leadframe 100 the mold compound 250 is in the same plane as the tie bar upper surface 125 (FIG. 6).

Figure 6:
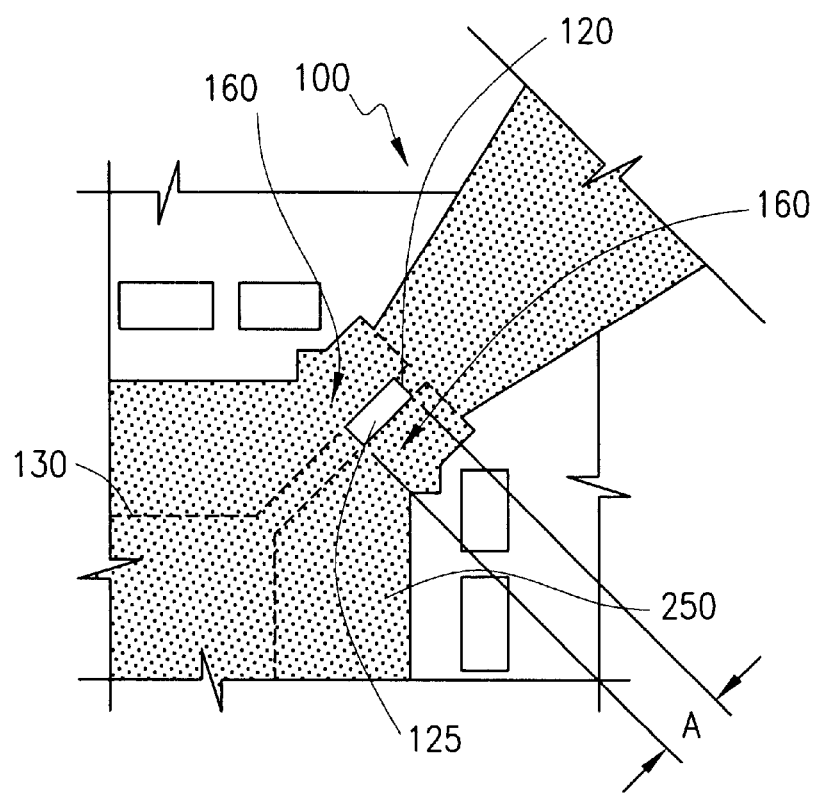
FIG. 6 is top plan view of a corner of the leadframe of FIG. 3 after a mold die has been removed during the molding process.

Referring now to FIG. 6, a top plan view of the leadframe 100 of FIG. 3 is shown subsequent to completion of the molding process after the removal of the mold die 180 (FIG. 4). The tie bar 120 is shown having the tie bar upper surface 125 free from the mold compound 250, in accordance with the above discussion. The mold inflow groove 160 is shown on both lateral sides of the tie bar 120 and allows the mold compound 250 to flow therethrough without contacting the tie bar upper surface 125. After molding, the tie bar upper surface 125 and the mold compound 250 are co-planar. As shown in FIG. 4, it can be appreciated that the mold compound 250 does not flow on the tie bar lower surface 127 of the respective tie bar 120.

While the present invention has been described primarily in the context of leadframes, it is recognized that the present invention may also be applied to many other applications. It will be obvious to those skilled in the art that various changes and modifications can be made without departing from the spirit and scope of the present invention, and it is intended to cover the claims appended hereto. All such modifications are within the scope of this present invention.

What is claimed is:

1. A leadframe, comprising:
a frame body having corners;
a plurality of tie bars extending inwardly from said corners of said frame body;
a die pad centered in said frame body having a contact with said tie bars, said die pad providing a site for which a semiconductor chip may be mounted;
a plurality of inner leads attached to said frame body at a first end and extending from said frame body towards said die pad at a second end; and
at least one mold inflow groove formed on a side of one of said plurality of inner leads and communicating with an area surrounding said inner leads, wherein said mold inflow groove is divided into two domains by each of said plurality of tie bars and said tie bars remain free of culls after molding.

2. The leadframe according to claim 1, wherein said mold inflow groove allows a mold compound to flow on both lateral sides of a respective tie bar at a point on said tie bar where a die/runner border crosses said tie bar.

3. The leadframe according to claim 2, wherein an upper side of said mold compound and an upper surface of said respective tie bar are in a same plane after molding.

4. The leadframe according to claim 2, wherein a side of said mold inflow groove adjacent to said respective tie bar is spaced apart from said die/runner border in a direction along said tie bar.

5. The leadframe according to claim 1, wherein a mold inflow groove is formed at each corner of said frame body.

6. The leadframe according to claim 1, wherein said mold inflow groove allows said leadframe to be level with a singulation die when said leadframe is placed on said singulation die.

7. A leadframe for a semiconductor device, comprising:

means for mounting a semiconductor die on said leadframe;

means for attaching said mounting means to said leadframe;

means for connecting said semiconductor die to one or more leads of said leadframe; and means for receiving a mold compound during a molding of said semiconductor die and said leadframe, said receiving means gating a flow of said mold compound so that said attaching means remains free of culls after molding, wherein said receiving means allows said mold compound to flow on both lateral sides of said attaching means at a point on said attaching means where a die/runner border crosses said attaching means.

8. The leadframe according to claim 7, wherein an upper side of said mold compound and an upper surface of said attaching means are in a same plane after molding.

9. The leadframe according to claim 7, wherein a side of said receiving means adjacent to said attaching means is spaced apart from said die/runner border in a direction along said attaching means.

10. The leadframe according to claim 7, wherein one of said receiving means is formed at each corner of said leadframe.

11. The leadframe according to claim 7, wherein said receiving means allows said leadframe to be level with a singulation die when said leadframe is placed on said singulation die.

12. The leadframe according to claim 7, wherein said receiving means is divided into two domains by said attaching means.

13. A semiconductor device, comprising:

a leadframe;

a semiconductor die attached to said leadframe and wire-bonded to one or more leads of said leadframe;

a mold compound formed around said semiconductor die and a portion of said leadframe; and a mold inflow groove configured to receive said mold compound during a molding process, said mold inflow groove formed on a side of one of said leads and communicating with an area surrounding said leads, wherein said mold inflow groove allows said tie bar to remain free of culls after said molding process is completed.

14. The semiconductor device according to claim 13, wherein said mold inflow groove allows said mold compound to flow on both lateral sides of said tie bar at a point on said tie bar where a die/runner border crosses said tie bar.

15. The semiconductor device according to claim 14, wherein an upper side of said mold compound and an upper surface of said tie bar are in the same plane after said molding process is completed.

16. The semiconductor device according to claim 14, wherein a side of said mold inflow groove adjacent to said tie bar is spaced apart from said die/runner border in a direction along said tie bar.

17. The semiconductor device according to claim 13, wherein a mold inflow groove is formed at each corner of said leadframe.

18. The semiconductor device according to claim 13, wherein said mold inflow groove allows said leadframe to be level with a singulation die when said leadframe is placed on said singulation die.

19. The semiconductor device according to claim 13, wherein said mold inflow groove is divided into two domains by said attaching means.

* * * * *